United States Patent [19]

Felts et al.

[11] Patent Number: 5,224,441
[45] Date of Patent: Jul. 6, 1993

[54] APPARATUS FOR RAPID PLASMA TREATMENTS AND METHOD

[75] Inventors: John T. Felts, Alameda; Hood Chatham, III, Fairfield; Joseph Countrywood, Napa; Robert J. Nelson, Walnut Creek, all of Calif.

[73] Assignee: The BOC Group, Inc., New Providence, N.J.

[21] Appl. No.: 767,146

[22] Filed: Sep. 27, 1991

[51] Int. Cl.$^5$ ............................................. C23C 16/50
[52] U.S. Cl. ........................ 118/718; 118/723; 118/724; 118/730; 422/186.05
[58] Field of Search .......... 118/718, 723, 730; 156/345; 422/186.04, 186.05, 186.06; 315/111.21, 111.41, 111.71

[56] References Cited

U.S. PATENT DOCUMENTS

| | | | |
|---|---|---|---|
| 3,898,952 | 8/1975 | Shirahata et al. | 118/723 X |
| 4,277,516 | 7/1981 | Behn et al. | 118/718 X |
| 4,384,918 | 5/1983 | Abe | 156/643 |
| 4,400,410 | 8/1983 | Green et al. | 427/569 X |
| 4,551,310 | 11/1985 | Imada et al. | 422/186.05 |
| 4,557,946 | 12/1985 | Sacher et al. | 427/41 |
| 4,559,112 | 12/1985 | Tamamura et al. | 204/12 |
| 4,599,678 | 7/1986 | Wertheimer et al. | 361/323 |
| 4,741,801 | 5/1988 | Coleman | 156/643 |
| 4,842,707 | 6/1989 | Kinoshita | 118/723 X |
| 4,847,469 | 7/1989 | Hofmann et al. | 219/273 |
| 4,863,756 | 9/1989 | Hartig et al. | 427/39 |
| 4,920,917 | 5/1990 | Nakatani et al. | 118/723 X |
| 4,960,073 | 10/1990 | Suzuki et al. | 118/723 |
| 4,968,918 | 11/1990 | Kondo et al. | 315/111.21 |
| 4,986,890 | 1/1991 | Setoyama et al. | 204/298.06 |
| 4,991,542 | 2/1991 | Kohmura et al. | 118/723 |
| 4,997,519 | 3/1991 | Kondo et al. | 156/643 |
| 5,009,738 | 4/1991 | Gruenwald et al. | 156/345 |
| 5,013,416 | 5/1991 | Murayama et al. | 204/192.1 |
| 5,041,304 | 8/1991 | Kusano et al. | 427/569 X |

FOREIGN PATENT DOCUMENTS

| | | |
|---|---|---|
| 0107510A2 | 5/1984 | European Pat. Off. . |
| 0198604A1 | 10/1986 | European Pat. Off. . |
| 0248274 | 12/1987 | European Pat. Off. ............ 118/718 |
| 0299754A2 | 1/1989 | European Pat. Off. . |
| 0406691A2 | 1/1991 | European Pat. Off. . |
| 0084516 | 5/1984 | Japan ................................ 118/718 |
| 0124038 | 7/1984 | Japan ................................ 118/718 |
| 59-213735 | 12/1984 | Japan . |
| 60-226533 | 11/1985 | Japan . |
| 61-207445 | 9/1986 | Japan . |
| 02-281420 | 11/1990 | Japan . |
| 02267267 | 11/1990 | Japan ................................ 118/718 |
| 03183782 | 8/1991 | Japan ................................ 118/718 |
| WO91/17561 | 11/1991 | PCT Int'l Appl. . |

Primary Examiner—Brian E. Hearn
Assistant Examiner—Jonathan D. Baskin
Attorney, Agent, or Firm—David A. Draegert; Larry R. Cassett

[57] ABSTRACT

A plasma treating apparatus is useful for coating substrates with thin films having vapor barrier properties at relatively rapid deposition rates. The apparatus comprises an evacuable chamber, an electrically powered electrode defining a plasma-facing surface within the chamber, and a shield spaced a distance Δ transverse to the plasma-facing surface. During plasma treatments, the plasma is confined to within distance Δ while a substrate is continuously fed through the confined plasma.

19 Claims, 1 Drawing Sheet

APPARATUS FOR RAPID PLASMA TREATMENTS AND METHOD

FIELD OF THE INVENTION

The present invention relates to the plasma treatments of substrates, and more particularly to the rapid plasma enhanced deposition of silicon oxide based thin films on substrates to provide gas transmission barriers useful for packaging applications.

BACKGROUND OF THE INVENTION

Plasma polymerization, sometimes designated "plasma enhanced chemical vapor deposition," or "PECVD," has been a known technique to form films on various substrates. For example, mixtures of silane with or without oxygen, nitrous oxide or ammonia have been plasma polymerized to form silicon oxide films. Sacher et al., U.S. Pat. No. 4,557,946, issued Dec. 10, 1985 describes use of plasma polymerized coatings from organosilicon compounds to form a moisture barrier on the substrate by heating the substrate and controlling the plasma power level. Wertheimer et al., U.S. Pat. No. 4,599,678, issued Jul. 8, 1986, discloses use of an organosilicon in a glow discharge to coat thin film capacitors when these substrates are heated to a temperature in excess of 50° C.

In general, the films formed from organo-silicons have typically been formed at a relatively low deposition rate (as compared with, for example, magnetron sputtering), have tended to be soft, and often have been hazy. The requirement that the substrate be heated, as in Sacher et al. and Wertheimer et al., is also disadvantageous for some substrates.

A further problem with use of organosilicon compounds in plasma enhanced deposition has been the variation in polymerization conditions and lack of control during the deposition. The traditional method used to control plasma processes has been the use of power, pressure and flow to monitor and attempt to control the process. However, these three variables represent inputs and do not accordingly control the thin films being produced. As a consequence, the scale-up of such a process is extremely complex.

In early microelectronic PECVD reactors, the plasma was generated between two parallel, circular electrodes. The wafers were loaded onto the lower, electrically grounded, electrode. The upper electrode was connected to a rf generator through an impedance matching network. The reactants were fed in from a gas ring, entered the plasma region (i.e., the region between the electrodes) at its outer edge, and flowed radially in toward a pumping port at the center of the electrode. These reactors have commonly been known as "radial flow" reactors.

In "inverse" radial flow reactors, the gas inlet has been at the center of the lower electrode, with the gas flow directed radially outward. A magnetic drive assembly permitted rotation of the lower electrode, thus randomizing the substrate position and optimizing deposition uniformity.

In hot-wall, batch PECVD systems, the deposition chamber consisted of a quartz tube placed within a resistively heated furnace. Vertically oriented graphite slabs carried the wafers in slots. Every other slab was connected to the same rf power terminal and a glow discharge was generated between adjacent electrodes. The reactants were directed along the axis of the chamber tube and between the electrodes.

More recently, PECVD has been employed to coat large substrates, e.g., plastic containers and long rolls of flexible films for food packaging applications. In the process described by Ser. No. 07/426,514, filed Oct. 24, 1989, of common assignment herewith, plasma polymerization is used to deposit silicon oxide based thin films from volatile organosilicon compounds. This method of depositing an adherent, hard silicon oxide based film comprises providing a gas stream with several components, establishing a glow discharge plasma derived from the gas stream, or one of its components, in a previously evacuated chamber with a substrate removably positioned in the plasma, and controllably flowing the gas stream into the plasma to deposit a silicon oxide onto the substrate when positioned in the plasma. The gas stream components include a volatilized organosilicon compound, oxygen, and an inert gas such as helium or argon.

The gas stream is controllably flowed into the plasma by volatilizing the organosilicon exterior to the chamber and admixing metered amounts of organosilicon with oxygen and the inert gas. Controlling the flowing gas stream into the plasma preferably includes adjusting the amount of organosilicon entering the chamber during the deposition. Control can be achieved with use of the flow vaporizer described by U.S. Pat. No. 4,847,469, issued Jul. 11, 1989, inventors Hofmann et al.

Films with reduced permeability to vapors such as water, oxygen, and carbon dioxide are useful for a variety of applications, one of which is to package foods. Such films are typically composites of materials. For example, one layer is often a flexible polymer, such as a polyethylene or polypropylene, while another layer is coated on or coextruded with the one layer and serves as a barrier layer. Barrier layers can generally be viewed as substantially organic based or substantially inorganic based.

Plasma assisted or enhanced processes, in addition to coating applications such as above described, include plasma etching or cleaning where substrate surfaces are modified. Plasma etching, for example, is used in manufacturing integrated electronic circuits.

A variety of equipment for plasma treatments are known. U.S. Pat. No. 4,863,756, issued Sep. 5, 1989, inventors Hartig et al., describes plasma coating equipment that includes magnets disposed to one side of an electrode while the other electrode side holds the substrate being coated, which faces a plasma.

U.S. Pat. No. 4,968,918, issued Nov. 6, 1990, inventors Kondo et al., discloses a plasma treating apparatus having a plurality of powered electrodes. The substrate being plasma treated is passed proximate to the powered electrodes.

U.S. Pat. No. 5,009,738, issued Apr. 23, 1991, inventor Gruenwald, discloses a plasma etching apparatus in which the substrate being treated is pressed against a cathode and the apparatus is said to achieve an improved heat elimination for the substrate during the etching process.

U.S. Pat. No. 5,013,416, issued May 7, 1991, inventor Murayama, discloses an apparatus for manufacturing transparent, conductive film by using an ion-plating method with a pressure-gradient plasma gun and intermediate electrodes for plasma control. The apparatus is said to permit manufacture of conductive films at high substrate velocity.

IN THE DRAWINGS

FIG. 1 is a general schematic diagram illustrating a plasma vacuum system with which embodiments of the invention can be used; and FIG. 2 schematically illustrates a side sectional view of the reaction chamber and its associated equipment utilizing various aspects of the present invention.

SUMMARY OF THE INVENTION

It is one object of this invention to provide an apparatus in which one can reproducibly deposit adherent, hard silicon oxide based thin films at commercially feasible, relatively rapid deposition rates on small or large substrates, preferably with preselected gas barrier properties.

In one aspect of the invention, a plasma treating apparatus comprises an evacuable chamber, means for forming a plasma within the chamber, an electrically powered electrode defining a plasma-facing surface within the chamber, means for communicating electricity from the electrode to a substrate and for exposing a continuously changeable portion of the substrate to plasma, and means for confining the plasma adjacent to the continuously changeable substrate portion being treated. The confining means confines the plasma at the substrate portion being plasma treated to within a distance Δ in combination with the apparatus elements, for achieving relatively rapid depositions of films that provide gas barrier properties. The confining means forms a ground plane with respect to the negatively biased electrode.

In another aspect of the present invention, a silicon oxide based film is deposited having vapor barrier properties. Practice of the invention permits preparation of particularly preferred flexible polymer substrate embodiments coated to have a permeability to oxygen gas that is less than about 0.1 cc/100 in$^2$/day with thin film thicknesses less than about 1000 Å at deposition rates greater than about 250 Å/sec. Such embodiments are useful where inert, flexible packagings with excellent vapor and gas barrier properties are required, such as for serum and blood bags in medical applications and for food packaging of very oxygen-sensitive foods, at commercial coating rates.

DETAILED DESCRIPTION OF THE PREFERRED EMBODIMENTS

Figure 1:
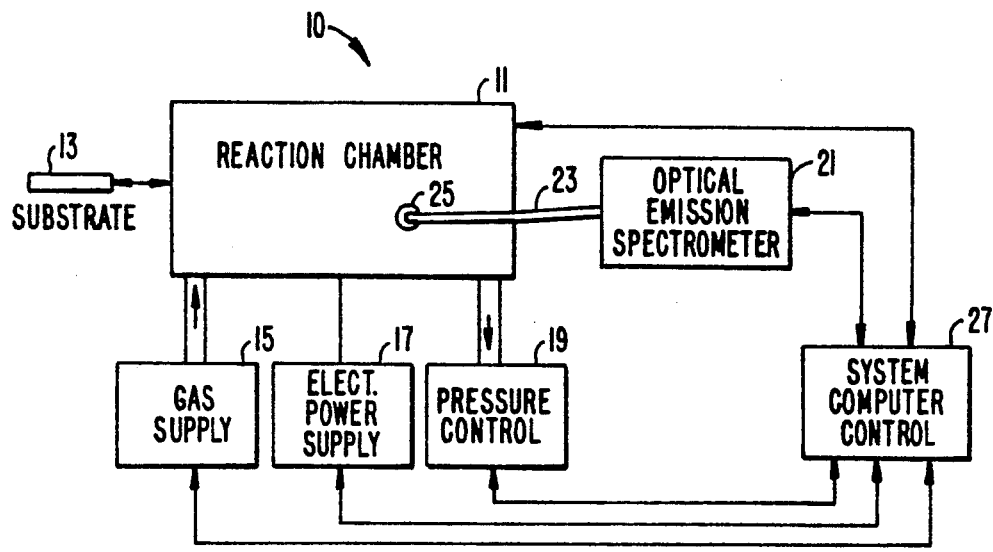

The inventive plasma treating apparatus is useful in coating applications, as well as plasma etching or cleaning where substrate surfaces are to be modified. The best mode contemplated for using the inventive plasma treating apparatus is where the substrate to be plasma treated is flexible. Flexibility of substrate being treated is due to the preferred configuration of the system that carries the substrate through the plasma during plasma treatment. This will be more fully discussed hereinafter.

Various flexible plastics, whether electrically conducting, semi-conducting, or non-conducting are suitable and may be coated in accordance with the invention. For example, various flexible plastics such as poly(ethyleneterephthalate) (PET) or polycarbonate (PC) resins, useful for packaging foods, may be coated in accordance with the invention to retard oxygen, carbon dioxide or moisture permeation. Although thicknesses of flexible substrates will be up to about 10 mils, the thicknesses are usually about 0.5-1 mil for food packaging applications.

The inventive apparatus is preferably used to prepare flexible films with reduced permeability to vapors such as water, oxygen, and carbon dioxide. It has been discovered, as described in Ser. No. 07/562,119, filed Aug. 3, 1990, of common assignment herewith, that gas transmission properties are a function of film thickness on flexible substrates and surprisingly have an optimal range of thickness to provide the maximal barrier properties, with both thicker and thinner films outside the optimal range having less desirable barrier properties. Articles prepared in accordance with the invention preferably are where a polymer substrate and thin film carried on the substrate together have a permeability to oxygen gas that is less than about 0.1 cc/100 in$^2$/day and the thin film has a thickness less than about 1000 Å, more preferably less than about 600 Å, most preferably the thin film has a thickness between about 100 Å to about 400 Å and the coated plastic film has an oxygen permeability of less than about 0.04 cc/100 in$^2$/day.

In one embodiment of the invention, a silicon oxide based film with vapor barrier properties is deposited from a glow discharge plasma derived from a gas stream including a volatilized organosilicon compound, oxygen, and an inert gas. Although the preferred process has an organosilicon compound as a starting material, the films therefrom are substantially inorganic as evidenced by bonding analysis. However, films that are silicone in nature may be prepared if desired, as further described hereinafter. The typical, substantially inorganic silicon oxide based films deposited in accordance with the invention are characterized by a high degree of crosslinking (determined by Fourier transform infrared spectroscopy, or FTIR). Gas stream control for such an embodiment is preferably by means of plasma diagnostics, as described by U.S. Pat. No. 4,888,199, issued Dec. 19, 1989, inventors Felts and Lopata.

The combination of oxygen component and inert gas component with the volatilized organosilicon component has been found greatly to increase the hardness property of thin films. Films prepared either with the organosilicon combined only with oxygen or the organosilicon combined only with an inert gas such as helium or argon had a hardness measured by the ASTM D3363-74 (standard test method for film hardness) pencil test of only 2 or 3. By contrast, films made with a combination of organosilicon, oxygen, and inert gas in accordance with the invention have hardnesses by this test of about 7 to about 9+. The numbers reported are based on a scale of 0 to 10 where 0 means the least scratch resistance, while 10 means there was no damage to the coating when abraded in accordance with ASTM D3363-74. Accordingly, thin films can be prepared that are typically harder by a factor of 2 or 3 with respect to films deposited with the volatilized organosilicon component in combination with either oxygen or inert gas.

Suitable organosilicon compounds for the gas stream are liquid at about ambient temperature, and when volatilized have a boiling point above about ambient temperature. These include methylsilane, dimethylsilane, trimethylsilane, diethylsilane, propylsilane, phenylsilane, hexamethyldisilane, 1,1,2,2-tetramethyl disilane, bis(trimethylsilyl) methane, bis(dimethylsilyl) methane, hexamethyldisiloxane, vinyl trimethoxy silane, vinyl triethoxy silane, ethylmethoxy silane, ethyltrimethoxy silane, divinyltetramethyldisiloxane, divinylhexamethyltrisiloxane, and trivinylpentamethyl-trisiloxane.

Among the preferred organosilicons are 1,1,3,3-tetramethyldisiloxane, hexamethyldisiloxane, vinyltrimethylsilane, methyltrimethoxysilane, vinyltrimethoxysilane and hexamethyldisilazane. These preferred organosilicon compounds have boiling points of 71° C., 101° C., 55.5° C., 102° C., 123° C., and 127° C., respectively.

The volatilized organosilicon component is preferably admixed with the oxygen component and the inert gas component before being flowed into the chamber. The quantities of these gases being so admixed are controlled by flow controllers so as to adjustably control the flow rate ratio of the gas stream components.

The organosilicon compound and oxygen of the gas stream during the depositing may be, for example, in a flow rate ratio of about 0.1:1.0 and the inert gas of the gas stream preferably is helium or argon, more preferable is helium. When the inert gas is helium or argon, then a suitable flow rate ratio of organosilicon compound, oxygen and inert gas is about 0.1:1.0:1.0. Other flow rate ratios may be used, however, if desirable.

In addition to organosilicon, oxygen and inert gas in the gas stream, minor amounts (not greater than about 1:1 with respect to the organosilicon, more preferably about 0.4 to 0.1:1 with respect to the organosilicon) of one or more additional compounds in gaseous form may be included for particular desired properties. For example, inclusion of a lower hydrocarbon such as propylene improves many frequently desired properties of the deposited films (except for light transmission), and bonding analysis indicates the film to be silicon dioxide in nature. Use of methane or acetylene, however, produces films that are silicone in nature. The inclusion of a minor amount of gaseous nitrogen to the gas stream increases the deposition rate, improves the transmission and reflection optical properties on glass, and varies the index of refraction in response to varied amounts of $N_2$. The addition of nitrous oxide to the gas stream increases the deposition rate and improves the optical properties, but tends to decrease the film hardness. A particularly preferred gas stream composition has 500 to 1,000 SCCM organosilicon, 3,000 to 8,000 SCCM $O_2$, and 3,000 to 5,000 SCCM He.

Figure 2:
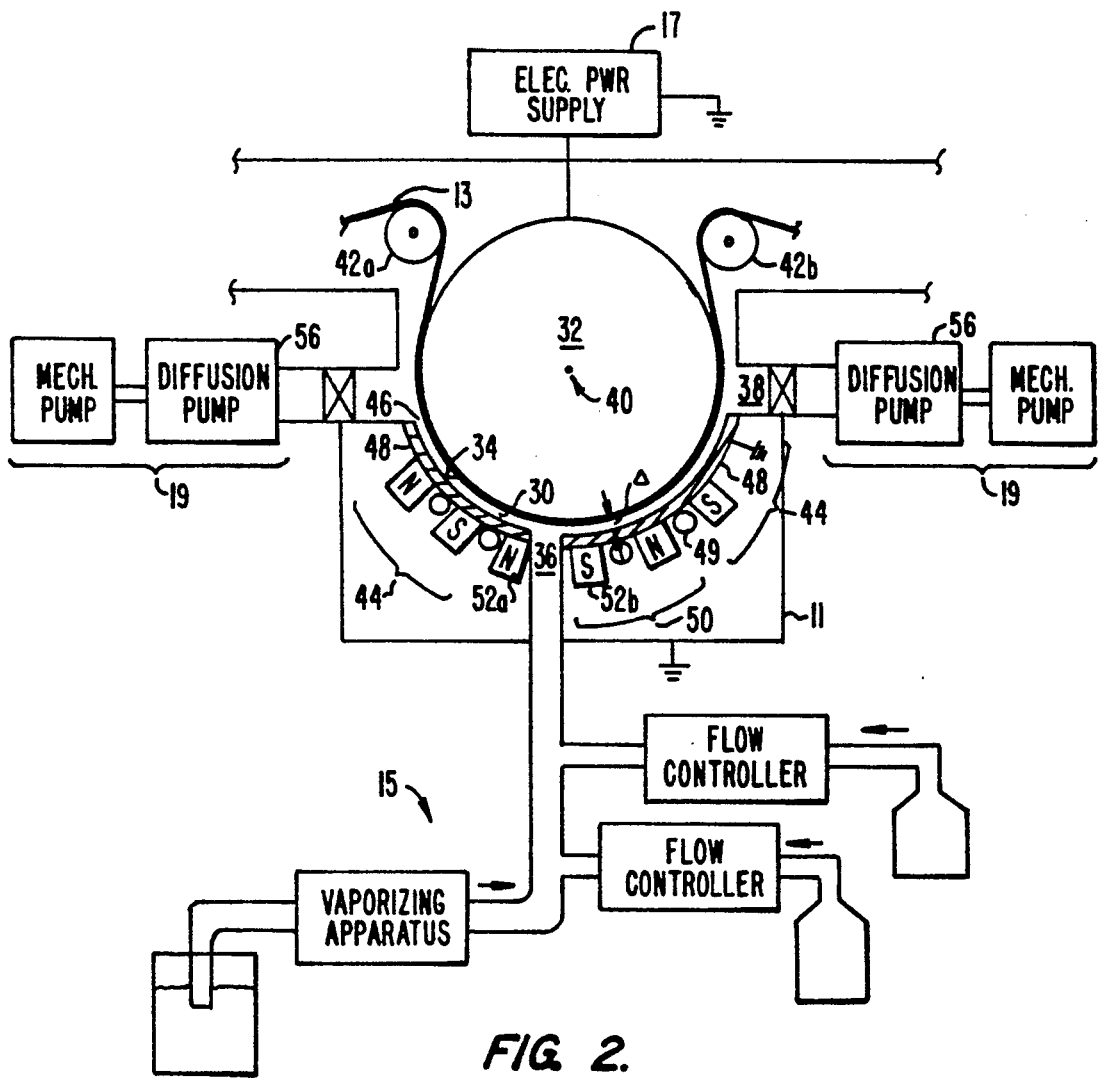

Although the inventive apparatus that will now be more specifically described with reference to FIGS. 1 and 2 is preferably used to reproducibly deposit adherent, hard silicon oxide based thin films from a plasma that is derived from a gas stream including organosilicon, oxygen, and inert gas, one can also use the inventive apparatus for plasma etching or cleaning or non-$SiO_x$ chemistry.

Turning to FIG. 1, a plasma treating apparatus 10 embodiment is schematically illustrated that includes an enclosed chamber 11 in which a plasma is formed and in which a substrate, such as substrate 13, is continuously introduced for plasma treating. One or more gases are supplied to the chamber 11 by a gas supply system 15. Where, for example, one wishes to prepare articles with vapor barrier properties, then gas supply system 15 can supply the oxygen component, inert gas component and volatilized organosilicon component. However, if one wishes to plasma etch, for example, then gas supply system 15 can supply oxygen, or oxygen and helium, or a suitable etchant gas mixture (e.g., oxygen and a halogen component).

An electric field within chamber 11 is created by a power supply 17. Power supply 17 typically provides about 8 kW during plasma treatments such as vapor barrier coating. Chamber 11 is evacuable, and a low pressure is maintained by a pumping and pressure control system 19. Chamber 11 and the pumps/pressure control system 19 should be capable of maintaining a pressure of less than about 0.1 torr during plasma treatment, and more preferably 0.05 torr.

An optical emission spectrometer 21 is preferably connected through an optical fiber light transmission medium 23 to the chamber 11 in some appropriate manner to couple the visible and near visible (especially the ultraviolet range) emission of the plasma to the spectrometer. A quartz window 25 in a sidewall of the reaction chamber can be used to optically couple the plasma emission with the exterior fiber medium 23. A general system control 27, including a computer controlled portion, is connected to each of the other components of the system in a manner to receive information from them and to send controlling commands to them. Control of coating processes through use of readings from spectrometer 21 is more fully described by U.S. Pat. No. 4,888,199, incorporated by reference.

A more detailed explanation of chamber 11 will now be given with respect to FIG. 2 (where a PECVD, or plasma polymerization, process as the plasma treatment is exemplified).

Chamber 11 includes means 30 for forming a plasma within chamber 11. The plasma forming means 30 includes an electrically powered electrode 32 defining a plasma-facing surface 34 within chamber 11. Plasma forming means 30 in the embodiment illustrated by FIG. 2 also includes a source of film-forming gas, such as the gas supply system 15 with gas inlet 36.

Substrate 13 is continuously fed into, through, and out of chamber 11 as a strip, or web, with a continuously changeable portion of substrate 13 being exposed to the plasma so as to be plasma treated, such as coated with a thin film having vapor barrier properties. While a continuously changeable portion of substrate 13 is being plasma treated, substrate 13 is also negatively biased. These two functions are achieved by a means 38 for communicating electricity from electrode 32 to substrate 13 when within chamber 11 and for exposing a continuously changeable portion of the substrate to the plasma during plasma treatment. Negative bias assists in focusing the deposition onto the substrate and permits deposition with lower power settings. However, when the substrate is conductive, then one can bias substantially directly (that is, without a separate electrode).

One embodiment of communicating and exposing means 38 is wherein electrode 32, or at least its plasma-facing surface 34, is cylindrical, or drum-like, although generally arcuate configurations that extend along an axis 40 can be used. The purpose of such an arcuate, or cylindrical, configuration for plasma-facing surface 34 is so that a flexible substrate 13 can be placed into rolling contact with the plasma-facing surface 34 and thus fed as a web, such as with the assistance of secondary rollers 42a, 42b which can be adjusted to tension substrate 13 when fed through the plasma while a negative bias is imposed upon at least that portion of the substrate being exposed to the plasma at any one point in time during the plasma treatment. The substrate portion is within a confined plasma because a means 44 confines the plasma to a band 46 having a dimension, or width, as distance Δ. Distance Δ extends transversely to plasma-facing surface 34 and axis 40. As will be discussed and exemplified hereinafter in more detail, the plasma confinement is crucial for achieving high utilization of the process gas and power with resultant high deposition rates. Confining means 44 thus confines the plasma to the continuously changeable portion of substrate 13 and to within distance Δ outward (radially outward when surface 34 is cylindrical) from the substrate. Distance Δ should be not greater than about 12 inches, more preferably be not greater than about 4 inches, more preferably is in a range of about 2 inches to about 3 inches. Distance Δ preferably is not less than about 0.5 inch because otherwise the plasma will tend to be extinguished.

Confining means 44 preferably includes a shield 48 that is mounted in chamber 11 so as to be spaced the distance Δ from the plasma-facing surface 34. Where plasma-facing surface 34 is cylindrical, then shield 48 will be coaxial therewith, and the length of its arc (thus defining the length of plasma band 46) is preferably about 70% of the cylindrical drum surface (that is, an arc of approximately 250°), but should be at least an appreciable arcuit length in order to allow high speed plasma treating of the flexible substrate material.

Shield 48 is preferably cooled, such as by various cooling means known to the art and generally illustrated by cooling tubing 49. Shield 48 should be electrically grounded and thus establishes a "ground plane" (that is, a return path for the power supply). It is believed preferable to form shield 48 as part of a chamber 11 wall with the pressure within the shield 48 (defined by distance Δ and the arc length for shield 48) being greater than the surrounding chamber 11 space, which is evacuated at about 1 micron or less.

Confining means 44 preferably further comprises magnetic means 50 for generating a magnetic field within the plasma. Magnetic means 50 may be at least one magnetic pole pair 52a, 52b positioned adjacent to shield 48, such as by being mounted on shield 48 on the shield side obverse with respect to the shield side facing the plasma. A plurality of magnetic pairs are preferred with alternating pole configuration around the entire shield 48. As illustrated in FIG. 2, cooling lines 49 are preferably interposed between such alternating magnetic pole pairs. As exemplified by the FIG. 2 embodiment, the gas inlet 36 is symmetrically disposed with respect to the arc length of shield 48 and pumps 56 are preferably positioned symmetrically at each open end of shield 48.

The inventive apparatus 10 embodiment as has been described will now be further exemplified by reference to the preparation of a substrate with vapor barrier properties using an inventive apparatus in Example 1, and Example 2 also exemplifies distance Δ experiments.

Example 1 illustrates practice of the substrate preparation method through use of the inventive apparatus.

EXAMPLE 1

A gas mixture of four-tenths of a standard liter per minute (SLM) of 1,1,3,3,-tetramethyldisiloxane (TMDSO), five SLM of oxygen and four SLM of helium was introduced to the process chamber by a linear gas manifold. The vacuum pumping was adjusted to yield a process zone pressure near 45 millitorr. The capstan tensions of the rollers were set at about 17 pounds and the rewind and unwind tensions were set at about 10 pounds. The linespeed of the PET web was established at 100 feet per minute. The drum was electrically powered with four kilowatts at a frequency of 50 kilohertz. The pumping was then tuned to obtain a process pressure of 60 millitorr. A liquid with high thermal conductivity and extremely low electrical conductivity was chilled and circulated through the drum, so as to keep the drum temperature at 20° C. The plasma confinement shield was water cooled to 40° C., and had ten magnet bars arranged at regularly spaced intervals parallel to the axis of the powered drum. The magnetic field along each magnet bar faced the same direction, while from magnet bar to magnet bar the magnetic field was reversed 180 degrees, resulting in a multipole arrangement. The length (arc) of the deposition zone was 27 inches.

The substrate Was PET of 12 $\mu$m thickness coated as described above with a silicon oxide based coating, which resulted in a mean oxygen transmission rate of 1.5 cc/m$^2$ deviation of 0.2 cc/m$^2$/day for cc/m$^2$/day (with a standard deviation of 0.2 cc/m$^2$/day for five samples). The film thickness was about 30 nm with a composition determined to be about 33% silicon and 67% oxygen.

EXAMPLE 2

A statistically designed experiment was performed to determine an optimum distance Δ. In this designed experiment, the TMDSO flow was varied from 0.74 to 0.52 SLM, the oxygen flow from 5 to 3 SLM, the power from 6 to 5 kW, and the distance Δ from 3 to 1 inch. In this range of variables, the distance Δ and the TMDSO flow were the variables which had the most significant effects on the oxygen gas transmission rate. Furthermore, in this range of variables, the results suggest that the smaller separation Δ yields a lower oxygen transmission rate. Current commercial manufacturing mechanical limitations typically allow for a minimum Δ of about two inches, which was the spacing used in Example 1 above.

It is to be understood that while the invention has been described above in conjunction with preferred specific embodiments, the description and examples are intended to illustrate and not limit the scope of the invention, which is defined by the scope of the appended claims.

What is claimed is:

1. A plasma treating apparatus comprising:
an evacuable chamber;
means for forming a plasma within the chamber, the plasma forming means including an electrically powered electrode defining a plasma-facing surface within the chamber;
means for communicating electricity from the electrode to a substrate when the substrate is within the chamber by placing the plasma-facing surface into rolling contact with the substrate and for exposing a continuously changeable portion of the substrate to plasma during plasma treatment; and,
means for confining the plasma adjacent to the continuously changeable substrate portion, the confining means including a grounded shield.

2. The apparatus as in claim 1 wherein the electrically powered electrode is negatively biased with respect to the confining means.

3. The apparatus as in claim 1 wherein the confining means confines the plasma at the changeable substrate portion and to within a distance Δ between about 0.5 inch to about 12 inches outwardly therefrom.

4. The apparatus as in claim 3 wherein the grounded shield is cooled, spaced at least Δ from the changeable substrate portion and the plasma is substantially confined between the changeable substrate portion and the shield.

5. The apparatus as in claim 4 wherein the plasma-facing surface is arcuate and longitudinally extends along an axis, and the shield is coaxial therewith.

6. The apparatus as in claim 4 wherein the confining means includes magnetic means for generating a magnetic field extending into the plasma and intersection the plasma-facing surface.

7. The apparatus as in claim 7 wherein the magnetic means includes at least one magnetic pole pair positioned adjacent to the shield.

8. The apparatus as in claim 4 wherein the chamber is adapted to be maintained at less than about 0.1 torr during plasma treatment of the substrate.

9. The apparatus as in claim 8 wherein the plasma forming means includes a source of film-forming gas, the gas being capable of forming an adherent substrate coating during plasma treatment of the substrate.

10. The apparatus as in claim 9 wherein the plasma forming means includes an inlet associated with the grounded shield for introducing a film-forming gas stream from the source thereof into the distance $\Delta$.

11. The apparatus as in claim 1 wherein the plasma-facing surface is cylindrical.

12. The apparatus as in claim 11 wherein the substrate is substantially electrically non-conductive and flexible.

13. The apparatus as in claim 1 wherein the substrate is substantially electrically conductive and the plasma-facing surface is formed by the substrate.

14. A thin film coating apparatus comprising:
a chamber evacuable to less than about 0.1 torr;
means for forming a plasma within the chamber from a film-forming gas stream, the film forming gas stream capable of depositing an adherent coating onto a substrate;
means for confining the plasma to a continuously changeable portion of a substrate being fed through the chamber during coating thereof and to within a distance $\Delta$ outward therefrom, the confining means including a grounded shield; and
means for negatively biasing the substrate portion being coated with respect to the chamber and with respect to the grounded shield.

15. The coating apparatus as in claim 14 wherein the distance $\Delta$ is between about two inches to about four inches.

16. The coating apparatus as in claim 14 wherein the grounded shield is cooled and is spaced at least the distance $\Delta$ from the changeable substrate portion.

17. The coating apparatus as in claim 16 wherein the plasma-facing surface is arcuate and longitudinally extends along an axis, and the shield is coaxial therewith.

18. The coating apparatus as in claim 17 wherein the magnetic means includes at least one magnetic pole pair positioned adjacent to the shield.

19. The coating apparatus as in claim 14 wherein the negative biasing means includes an electrode defining a plasma-facing surface within the chamber, and the changeable substrate portions are rollingly contacted therewith during coating.

* * * * *

UNITED STATES PATENT AND TRADEMARK OFFICE
CERTIFICATE OF CORRECTION

PATENT NO. : 5,224,441
DATED : July 6, 1993
INVENTOR(S) : John T. Felts, et al

It is certified that error appears in the above-indentified patent and that said Letters Patent is hereby corrected as shown below:

Column 9, at claim 6, line 3: "intersection" should read --intersecting--

Column 9, at claim 7, line 1: "claim 7" should read --claim 6--

Signed and Sealed this

Fifth Day of December, 1995

Attest:

BRUCE LEHMAN

*Attesting Officer*  *Commissioner of Patents and Trademarks*